United States Patent [19]

Bertin

[11] Patent Number: 4,602,170
[45] Date of Patent: Jul. 22, 1986

[54] RESISTIVE GATE FIELD EFFECT TRANSISTOR LOGIC FAMILY

[75] Inventor: Claude L. Bertin, Burlington, Vt.

[73] Assignee: International Business Machines Corporation, Armonk, N.Y.

[21] Appl. No.: 530,450

[22] Filed: Sep. 8, 1983

[51] Int. Cl.⁴ .................. H03K 19/094; H03K 19/20; H03K 29/76; H03K 29/50
[52] U.S. Cl. .................. 307/450; 307/448; 307/473; 307/304; 357/23.14
[58] Field of Search .................. 307/450, 448, 299 R, 307/304, 473; 357/23.5, 23.14

[56] References Cited

U.S. PATENT DOCUMENTS

| | | | |
|---|---|---|---|
| 3,714,522 | 1/1973 | Komiya et al. | 357/23.14 |
| 3,775,693 | 11/1973 | Proebsting | 307/450 |
| 3,946,418 | 3/1976 | Sigsbee | 307/304 X |
| 3,968,452 | 7/1976 | Sahara et al. | 357/23.14 X |
| 4,074,151 | 2/1978 | Buckley et al. | 307/448 X |
| 4,157,557 | 6/1979 | Sato et al. | 357/23.14 X |
| 4,158,239 | 6/1979 | Bertin | 307/279 X |

FOREIGN PATENT DOCUMENTS 0039064 3/1983 Japan .................. 357/23.14

OTHER PUBLICATIONS

Hu et al, "A Resistive-Gated IGFET Tetrode"; *IEEE Trans. on Electron Devices*, vol. ED-18, No. 7, pp. 418-425; 7/1971.

*Primary Examiner*—Larry N. Anagnos
*Attorney, Agent, or Firm*—Sughrue, Mion, Zinn, Macpeak & Seas

[57] ABSTRACT

A family of digital logic circuits constructed with resistive gate field effect transistors is provided. The logic circuits are comprised of AND and OR circuits, each implemented with resistive gate devices. In constructing the AND circuit, the resistive gate lies along the length of the channel region between the source and drain of the device. Logic input signals are selectively applied along the length of the channel region to the resistive gate. The device will conduct between source and drain only if all points along the channel are above the local threshold voltage of the channel region which will occur when appropriate logic signals are applied simultaneously to all logic input terminals. A logic OR device is realized when the resistive gate is formed transverse to the channel such that each input to the gate controls a portion of the channel between the source and drain. NAND and NOR circuits are provided using the resistive gate logic device in an inverter circuit.

7 Claims, 13 Drawing Figures

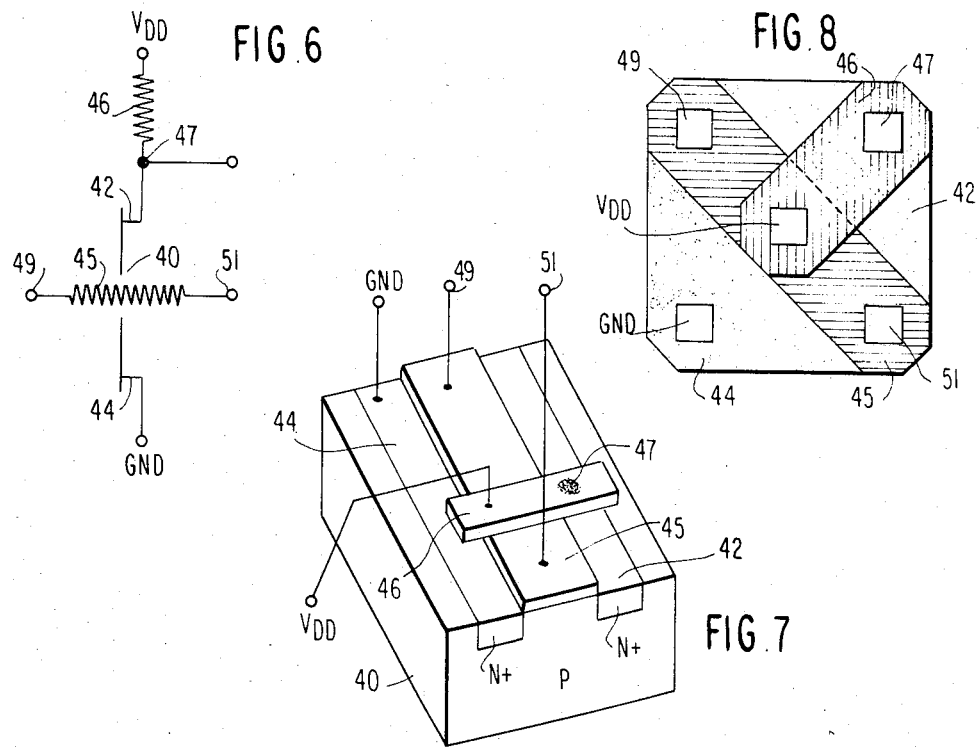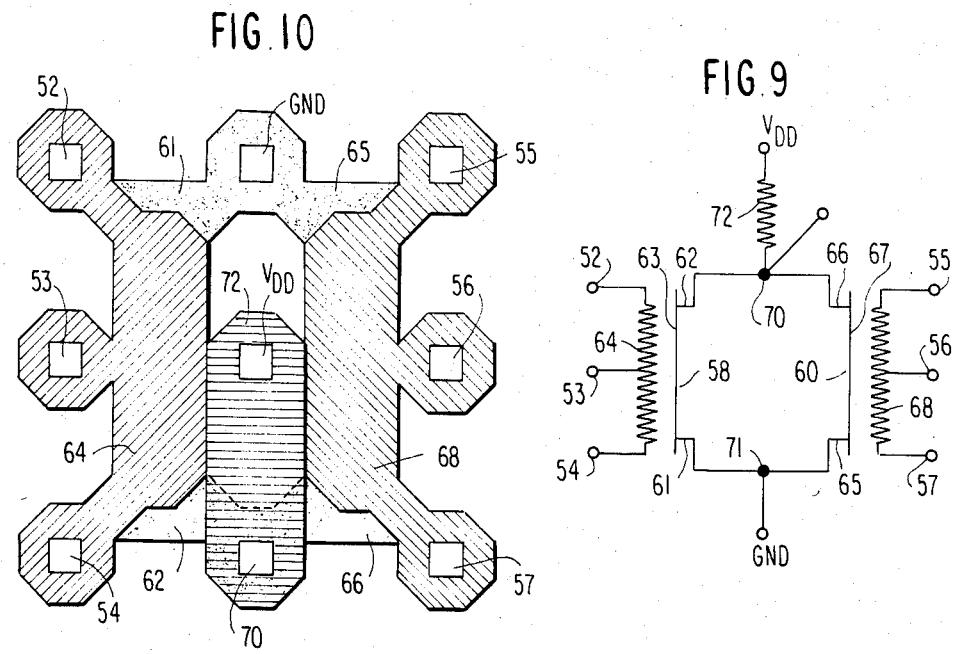

RESISTIVE GATE FIELD EFFECT TRANSISTOR LOGIC FAMILY

FIELD OF INVENTION

The invention relates to field effect transistors and more particularly to field effect transistors as circuit elements of monolithic integrated circuits.

BACKGROUND OF THE INVENTION

In digital electronics, logic circuits exhibiting such logic functions as AND, OR, NAND and NOR are produced as integrated circuits with several logic circuits being fabricated on a single integrated circuit chip. Integrated circuit technology has lead to miniaturization of electronic circuits facilitating the placement and use of digital electronics in locations once thought impossible. A continuing goal of circuit design is to increase circuit density thereby broadening areas of use for electronic circuits.

Field effect transistors are known active circuit elements which have been widely used in integrated circuits. Basically, the field effect transistor (FET) is comprised of a semiconductor substrate exhibiting one type of conductivity into which is formed, by diffusion for example, source and drain regions each of the same conductivity-type but opposite in conductivity to that of the substrate. A channel region separates the source from the drain. The gate is situated over the channel and separated therefrom by insulating material. Separate electrodes are connected to each of the source, drain and gate areas. The application of appropriate electrical potentials to the source, drain and gate electrodes produces electrical current between the source and drain through the channel. One type of FET, using a P-type silicon substrate, undergoes conventional processing to create two N+ conductivity-type diffusion regions forming the source and drain regions. These regions are located to create a channel region therebetween. An isulating material such as silicon dioxide is formed over the channel region with a metal gate being deposited over the insulation. Electrodes are connected to the source, drain and gate. As is known, device dimensions, doping of the semiconductor material, etc., are controlled to give the device predetermined characteristics such as channel threshold voltage. Applying an external potential of proper polarity to the channel overcomes this threshold voltage, causing the device to conduct through the channel. The external potential is applied directly to the gate through the gate electrode and to the channel by field effect action across the insulator. This gate bias controls the passage of charge carriers along the current path through the channel area.

In recent years, it has become known that a resistive layer instead of a metallic layer may be used as the FET gate. An FET using a resistive gate material is known as a resistive gate field effect transistor (REGFET). Such a device may use polysilicon material for the resistive layer, the resistivity of the resistive layer being determined by the selective doping to the polysilicon. For example, gate resistance values can be varied by ion implantation with boron (P. K. Ko et al, Design and Performance of Resistive Gated MOSFETS for Analog Integrated Circuits, IEDM, Dec. 5, 1979, page 22.2.). Resistive gate field effect transistors have generally been applied only to linear circuits, such as amplifiers.

Digital circuits comprised of FET devices have until recently been constructed with conductive gates, either metal or silicon. In U.S. Pat. No. 4,158,239, which issued June 12, 1979, and was assigned to the same assignee as the present invention, Bertin, the inventor of the invention disclosed herein describes a storage cell comprised of resistive gate FETs forming a flip-flop circuit. However, circuits exhibiting logic functions such as the AND and OR functions continued to be constructed with conductive gate FETs.

SUMMARY OF THE INVENTION

An object of the invention is to increase circuit packing density of a family of logic circuits.

It is a further object to reduce the number of circuit elements necessary to produce logic circuits.

These and other objects, as will become apparent from the detailed description of the preferred embodiments of the invention set forth hereinafter, are realized by the application of resistive gate field effect transistors to digital logic circuits.

Each logic circuit of the invention includes at least one REGFET, having a resistive gate receiving at least two logic input signals which control the presence or width of a channel region under the gate electrode. When the logic signal inputs are applied along the length of the channel between the source and drain regions, the device may be made to act as a coincidence gate exhibiting and AND logic function. For example, with an n-channel enhancement device, it will conduct only if all points along the channel are above the local threshold voltage of the channel region. If any input is less than the threshold voltage, the device will not conduct.

When the inputs are applied transverse to the channel, an OR gate circuit is formed since each input controls a portion of the channel between source and drain.

NAND and NOR circuits are provided by using the resistive gate logic device in an inverter circuit.

BRIEF DESCRIPTION OF THE DRAWINGS

FIG. 6 is a schematic circuit diagram of a NOR circuit using a resistive gate field effect transistor in accordance with the teachings of this invention.

FIG. 7 is an illustration of the layout of the NOR circuit using a resistive gate field effect transistor as shown schematically in FIG. 6.

FIG. 8 is a plan view of the layout of the NOR circuit using a resistive gate field effect transistor for the schematic diagram of FIG. 6.

FIG. 9 is a schematic circuit diagram of the AND-OR-INVERT logic circuit using resistive gate field effect transistors in accordance with the teachings of the invention.

FIG. 10 is a plan view of the layout of the AND-OR-INVERT logic circuit using resistive gate field effect transistors according to the invention.

DETAILED DESCRIPTION OF THE PREFERRED EMBODIMENT

Figure 1:
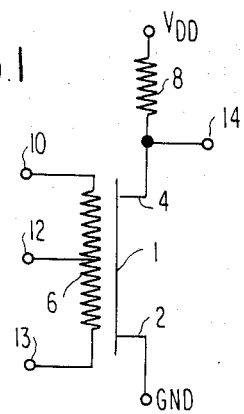
FIG. 1 is a schematic diagram of the NAND logic circuit using a resistive gate field effect transistor in accordance with the teachings of the invention.
Figure 2:
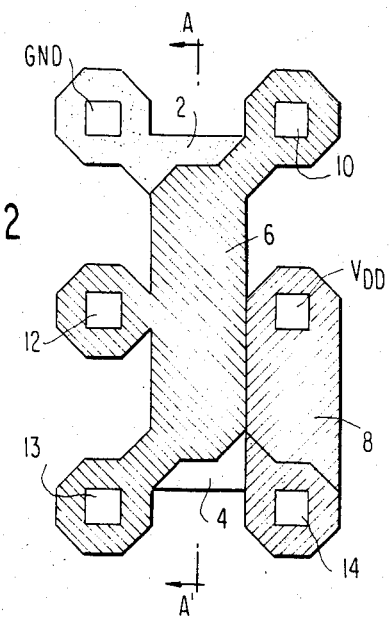
FIG. 2 is a plan view of the layout of the NAND circuit with a resistive gate field effect transistor for the schematic diagram of FIG. 1.

Referring to the accompanying drawings, FIG. 1 shows a circuit schematic of a three-input NAND-type resistive gate field effect transistor logic circuit. The device 1 includes a source 2, drain 4 and resistive gate 6. The drain is connected to a voltage supply $V_{DD}$ through a load resistor 8. The source 2 is connected to the circuit reference potential denoted herein as ground, GND. Three logic input signal terminals 10, 12, 13 are each connected to the resistive gate 6. The output terminal 14 is connected between the drain 4 and load resistor 8. FIG. 2 illustrates a plan view of the NAND circuit layout using the REGFET. Throughout the specification corresonding parts in different figures are designated by common numerical designations. Thus, the drain 4 of REGFET 1 shown in schematic form in FIG. 1 is designated by the numeral 4 in the layout design shown in FIG. 2.

In the preferred embodiments, silicon gate hexagonal-based layouts are selected. The transistor 1 is composed of a source diffusion 2 connected to ground and a drain diffusion 4 connected to the output node 14 and load resistance 8. The resistive gate 6 overlies the channel region separating the source and drain diffusions 2, 4 and is composed of a resistive layer of polycrystalline silicon. The resistive gate, insulated from the source and drain diffusions 2, 4 and the FET channel, is connected at each end to a different logic input signal terminal 10, 13. A third logic input signal terminal 12 is connected to the resistive gate 6 at a location between its ends such as midway between the points where the logic input signal inputs 10, 13 connect to the gate. The channel region lying between source 2 and drain 4 is formed with a channel threshold voltage $V_t$ which prevents current flow between the drain and the source except when each logic input signal terminal simultaneously receives a voltage corresponding to a logic high. For example, if each logic input signal is 5 volts, the threshold voltage $V_t$ of the REGFET 1 would be 1 to 1½ volts.

Figure 3:
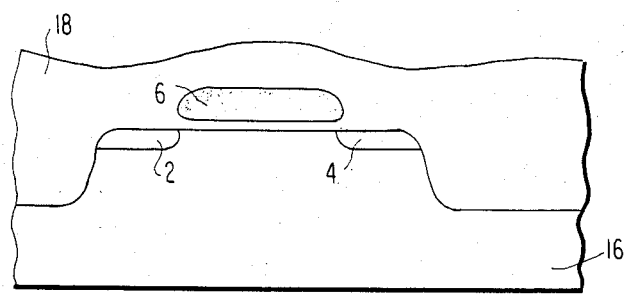
FIG. 3 is a cross-sectional view taken along the section line A—A' of FIG. 2.

FIG. 3 shows a cross section of the NAND circuit of FIG. 2 taken along the section line A—A'. Source and drain regions 2, 4 may be formed by conventional techniques such as ion implantation. The substrate 16 is selected for the purposed of this description to be P-type silicon. An insulating layer of silicon dioxide 18 is deposited over the substrate including the source and drain regions. Polysilicon gate 6 is deposited over the oxide layer 18. Additional silicon dioxide is then deposited. Thereafter, a hole is etched through the silicon dioxide over the drain region 4. A second layer of polysilicon 8 forming a low resistance layer, is deposited such that it fills the hole and contacts the drain region 4.

In fabricating the device of FIGS. 2 and 3, the P-type silicon substrate may have a resistivity of 10–15 ohms per centimeter. The N+ source and drain diffusions 2, 4 would be diffused to a depth of one-half micron and exhibit a resistivity of 20–30 ohms per square. The resistive gate 6 may be doped to obtain a resistivity of approximately 1 megaohm per square with a capacitance of approximately $10^{-15}$ fd. per square. The resistive layer 8 is preferably formed to exhibit a resistance of between 10 KΩ and 100 KΩ per square. Metalization for interconnections (not shown) are conventional and can be either at one or two levels. Contact formation is also conventional and, like the conductors for interconnections, do not in and of themselves form a portion of the invention.

Operation of the device depicted in FIGS. 1–3 is as follows. When a logic level signal of, for example, ground potential is applied to each of the input terminals 10, 12, 13, the channel is not inverted and the REGFET 1 is non-conducting between its source and drain regions. Therefore, the potential at the output terminal 14 is essentially $V_{DD}$, indicating a logic high output. When a logic high signal such as 5 volts is applied to any one of the logic input signal terminals 10, 12, 13, only a portion of the channel is inverted and, therefore, the FET remains off and the output terminal 14 remains at a logic high. Even if two logic input signal terminals received logic high signals, the threshold voltage of FET 1 is such that there is still only partial inversion of the channel and, therefore, FET 1 does not conduct between its source and drain. When a logic high signal is applied to each of the logic input signal terminals 10, 12 and 13, the device 1 conducts between its source 2 and drain 4, and the potential at the output terminal 14 approaches ground, signifying a logic low.

The coincidence gate configuration of the inverter is not limited to the specific embodiment illustrated in FIGS. 1-3. While a NAND circuit embodiment was described, an AND device may be realized by connecting a resistance between the source 2 and ground, and the output terminal to the source of the FET. Nor is the invention limited to a three-input coincidence gate. Two, four or other multiple input configurations are within the scope of the invention described herein. The limiting factor is that REGFET will not conduct current between its source and its drain until all inputs receive the same positive logic level input signal. Further, while the inventive embodiment has been described with respect to an enhancement device, depletion devices may also be utilized with appropriate modifications of voltage polarities.

Figure 4:
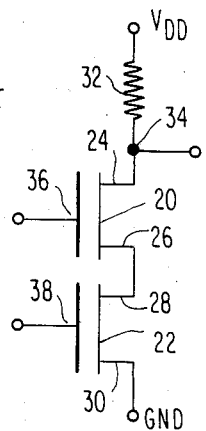
FIG. 4 is a schematic circuit diagram of a prior art NAND circuit using a conductive gate field effect transistor.
Figure 5:
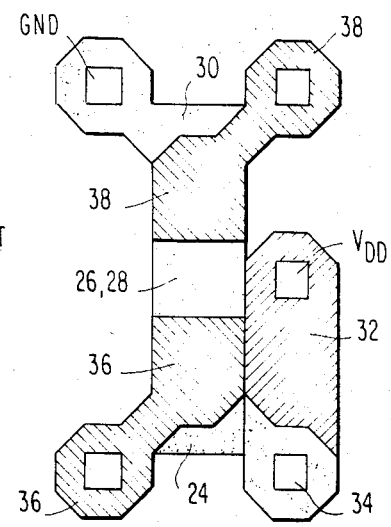
FIG. 5 is a plan view of the layout of the prior art NAND circuit using a conductive gate field effect transistor of FIG. 4.

That greater circuit density is realized with a REGFET implemented logic circuit can be verified by comparing the layout of the conventional two-input NAND circuit implemented with conductive gate FETs with that of the just described three-input NAND device using a REGFET. A schematic of the conventional two-input NAND circuit composed of two conductive gate FETs is illustrated in FIG. 4. It is comprised of FET 20 and FET 22. FET 20 has a drain 24 and source 26, while FET 22 has a drain 28 and source 30. The drain 24 is connected through a resistor 32 to the voltage supply $V_{DD}$. Output terminal 34 is connected to the drain of FET 20. The source of FET 22 is connected to the reference potential, GND. An insulated gate 36 controls the conductivity of the FET 20, while an insulated gate 38 controls the conductivity of the FET 22. Each of the gates 36, 38 is provided with a terminal for receiving logic input signals. The operation of the circuit of FIG. 4 is well known and, therefore, a description of its operation will not be included in this specification. FIG. 5 shows the plan view of the layout of the circuit shown schematically in FIG. 4. As can be seen on comparing FIGS. 2 and 5, the two-input NAND circuit comprised of two conductive gate FETs occupy essentially the same physical space as that of the three input NAND circuit utilizing a REGFET.

A NOR circuit composed of a resistive gate field effect transistor is illustrated schematically in FIG. 6. In this embodiment of the invention, the resistive gate is formed transverse to the channel direction. The logic input signal terminals are located at the ends of the gate, and thus the logic input signals are also supplied transverse to the channel.

FIG. 7 illustrates the geometry of the resistive gate field effect transistor when implemented as a NOR circuit. The illustration of FIG. 7 shows only those portions of the NOR logic circuit implemented with a single resistive gate field effect transistor necessary for an understanding of the general configuration of the NOR circuit arrangement. As should be obvious to those skilled in the art, the figure does not show the insulating layers between the substrate and the gate nor the insulating layer between the polysilicon resistance layer forming the load resistor and the polysilicon resistive gate.

FIG. 8 is a plan view of the NOR circuit layout using the resistive field effect transistor.

The NOR circuit includes a resistive gate field effect transistor 40 having a drain 42, source 44 and resistive gate 45. Load resistance 46 is connected between the voltage supply, $V_{DD}$ and the drain 42. The output is taken from node 47 while the circuit reference potential, GND, is connected to the source 44. Logic input signal terminals 49, 51 are adapted to receive logic input signals.

As can be seen from FIGS. 6, 7 and 8, the resistive gate 45 is formed transverse to the length of the channel between source 44 and drain 42 and parallel to the width of the channel between the source and drain regions in the FET substrate. The resistance layer 46 forming the device load resistance is formed on a second level over the gate 45 and may be positioned perpendicular to the gate 45 as illustrated. The drain and source regions 42, 44 are diffused into the substrate and are of a conductivity-type opposite to that of the substrate. For example, if the substrate is of P-type material, the source and drain diffusions are N+ regions. A dielectric layer of silicon dioxide (not shown) is deposited over the substrate including the source and drain regions. Next, the resistive gate 45 of polysilicon is deposited over the silicon dioxide layer and the substrate, as shown generally in FIGS. 7 and 8. That is, the polysilicon gate 45 extends along the channel width in the direction parallel to the source and drain diffusions. Another silicon dioxide layer (not shown) covers the resistive gate 45 to insulate the gate from the polysilicon layer 46 forming the circuit load resistance. This layer is preferably deposited, as shown, in a direction perpendicular to the gate 45. Such a layout of the polysilicon resistive layer 46 lends itself to compact circuit construction and thus increased circuit density.

The circuit metalization for conductive interconnections and the contact regions are not shown in detail for they are conventional. That is, the process for fabricating the contact regions which form the logic input signal terminals 49, 51, the output terminal 47 and the voltage supply terminal for receiving the supply voltage $V_{DD}$, as well as the circuit reference voltage, GND, is known to those skilled in the art and, therefore, a description of this process is not necessary for a full and complete understanding of the present invention. Likewise, the process for forming the conductive interconnection between the drain 42 and the resistive layer 46, as well as the conductive interconnection between the source 44 and its contact region for connecting the source to GND, along with the conductive interconnection of the resistive layer 46 to the contact region for connecting it to $V_{DD}$, etc. is also well known to those skilled in the art.

Preferably, the parameters for the NOR circuit semiconductor device are as follows. The silicon substrate may have a resistivity of 10–50 ohms per centimeter. The N+ source and drain diffusions would be diffused to a depth of approximately one-half micron and exhibit a resistivity of 20 to 30 ohms per square. The resistive gate may be doped to obtain a resistivity of approximately 1 megaohm per square with a capacitance of approximately $10^{-5}$ fd. per square. The resistive layer is preferably formed to exhibit a resistance of between 10 K$\Omega$ and $\phi$K$\Omega$ per square.

The operation of the NOR circuit of FIGS. 6, 7 and 8 will now be described. Logic input signals can be applied to either or both terminals 49, 51. The voltage levels of the logic input signals are selected such that a logic high signal will invert the channel in the channel region below that portion of the gate 45 receiving the logic signal and cause that portion of the channel to conduct. It has been found that the electrical field in the channel produced in response to a gate bias voltage extends primarily across the channel length between the source and drain regions and not in the direction of the channel width which extends parallel to the source diffusion and drain diffusion. Therefore, application of the logic high signal to terminal 49 will produce an electrical field in the area of the channel below terminal 49 of sufficient magnitude to invert the channel in that area and cause it to operate in the saturation mode.

However, the field does not extend along the entire channel width and, therefore, the gate region in the vicinity of terminal 51 is not inverted. Since the channel is partially saturated, current will flow between the source and drain through the channel and particularly in that portion of the channel underlying terminal 49. The partially conductive field effect transistor presents a lower resistance as compared to the non-conducting device, which lower resistance can be determined at the output terminal 47. As the resistance value of the field effect transistor falls, due to conduction, the potential at terminal 47 drops. Therefore, output terminal 47 presents a logic low signal in response to a logic high signal at terminal 49.

A logic high signal to terminal 51 causes the device to operate in the manner just described with respect to the application of a logic high signal to terminal 49. The only difference in operation is that the channel region in the vicinity of terminal 51 is saturated, causing current flow between the source and the drain regions through the channel area in the vicinity of 51. Thus, the output at output terminal 47 is a logic low in response to a logic high input signal to terminal 51.

If logic low input signals are applied to both logic input signal terminals 49, 50, no portion of the channel is inverted and there is no current flow through the channel between the source and drain diffusions. Terminal 47 will then exhibit a logic high. Representative voltages for logic high and logic low input signals are, 5 v, for the logic high input signal and 0 v for the logic low input signal. For the NOR circuit just described, with $V_{DD}$ at 5 volts, the output terminal voltage would be 0.5 volts in response to a logic high at either input terminal 49, 50 and 5 volts in response to logic lows at both input terminals.

FIGS. 9 and 10 illustrate a more complex, three high by two wide resistive gate field effect transistor, AND-OR-INVERT (AOI) circuit. The circuit includes six input terminals 52, 53, 54, 55, 56 and 57 to which three inputs connect to a first resistive gate field effect transistor 58 and another three inputs to a second resistive gate field effect transistor 60. The field effect transistor 58 includes a source diffusion 61 and drain diffusion 62, with a channel region 63 therebetween. A resistive gate 64 of polysilicon overlies the substrate containing the source, drain and channel regions and is formed to extend across the channel length between the source and drain. The resistive gate field effect transistor 60 includes source and drain diffusions 65, 66 with a channel region 67 therebetween. A resistive gate 68 formed of polysilicon is formed over the channel and extends across the channel between the source and drain. From the schematic diagram of FIG. 9, it can be seen that the AOI logic circuit is formed from the two NAND circuits described in connection with FIGS. 1, 2 and 3. The drain 62 of the REGFET 58 and the drain 66 of the REGFET 60 is connected to a common node 70. The source 61 of the REGFET 58 and the source 65 of the REGFET 60 connect to common node 71. Node 70 is the output node of the circuit and also serves as the connecting point for the load resistance 72 to the AND gate devices. The voltage supply, $V_{DD}$, connects to the load resistance 72 at its end opposite to its end connected to the node 70. The circuit reference potential, GND, is connected to node 71.

FIG. 10 illustrates the preferred layout for the circuit schematic of FIG. 9. Since the device of FIGS. 9 and 10 is a combination of two NAND circuits described hereinbefore, its structure and fabrication are essentially the same as that described for the NAND circuit illustrated in FIGS. 1, 2 and 3. Using a P-type substrate, a source and drain diffusion 61, 65 and 62, 66 are formed in the substrate to produce appropriate N+ regions with the channel region 63, 67 formed therebetween. After application of the appropriate dielectric layer over the substrate, two polysilicon layers 64, 68 are deposited to produce the resistive gates. These two polysilicon layers lie in a common plane and are electrically insulated from each other. After depositing another dielectric layer of, for example, silicon dioxide, over the polysilicon gate regions, a second layer of polysilicon 72 forming the common load resistance is deposited over the dielectric. As with the circuit described hereinbefore in connection with FIGS. 1, 2 and 3, suitable contact regions and conductive layers are provided during the fabrication to create the necessary electrically interconnections for the device shown in FIGS. 9 and 10.

The circuit operates to OR the outputs from the two, three input AND circuits. When neither REGFET 58 or 60 conducts, the output terminal 70 is at essentially $V_{DD}$ and exhibits a logic high. Since the REGFETs 58, 60 conduct only when all inputs are at logic highs, the output 70 will be at a logic high if at least one input to both resistive gate field effect transistors 58, 60 is at a logic low. If all inputs to resistive gate field effect transistor 58 are at logic highs, the REGFET 58 conducts, causing the potential at terminal 70 to approach ground, indicating a logic low. Similarly, if all inputs to logic input signal terminals 55, 56 and 57 of the REGFET 60 are at the logic high level, the resistor gate field effect transistor 60 conducts, and the potential at terminal 70 drops to the logic low level.

Figure 12:
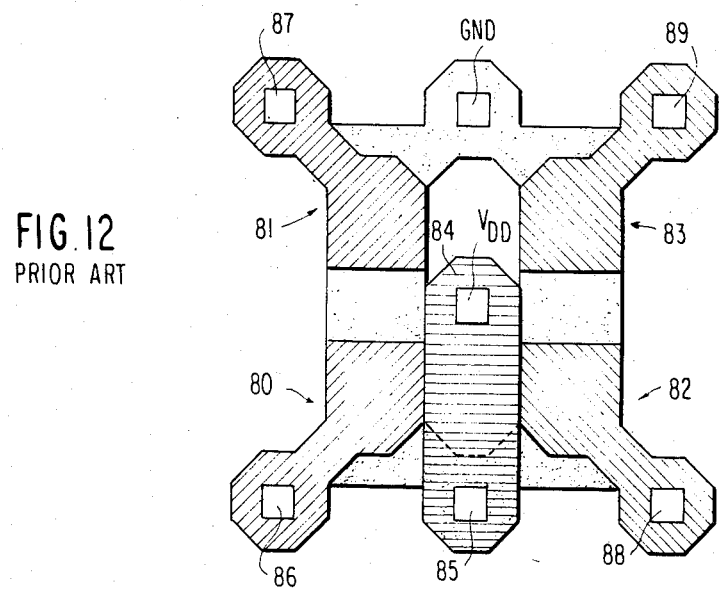
FIG. 12 is a plan view of the layout of the prior art AND-OR-INVERT logic diagram shown schematically in FIG. 11.
Figure 11:
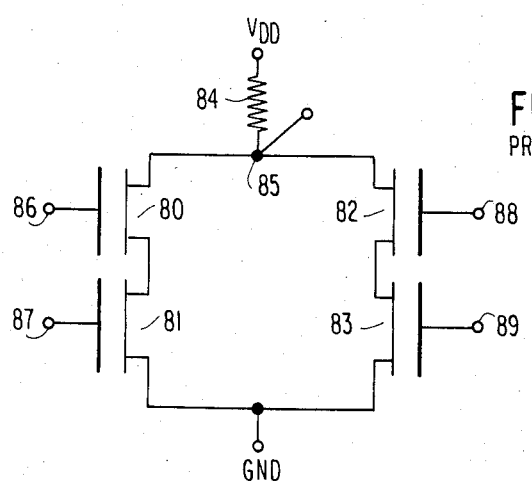
FIG. 11 is a schematic diagram of a prior art AND-OR-INVERT logic circuit using conductive gate field effect transistors.

The logic circuit of FIGS. 9 and 10 yields a device 50 percent more dense than the conventional AOI circuit comprised of conductive gate field effect transistors. FIGS. 11 and 12 illustrate the conventional AOI device made of conductive gate field effect transistors. The schematic circuit diagram of FIG. 11 shows that the conductive gate field effect transistor, AOI circuit is comprised of two interconnected, conventional AND circuits of the type illustrated in FIG. 4. One AND circuit includes conductive gate field effect transistors 80, 81, with the other AND circuit being comprised of conductive gate field effect transistors 82, 83. The load resistance 84 is connected to the drains of field effect transistors 80, 82 at node 85. The circuit reference potential connects to the source of each of the field effect transistors 81, 83. Each conductive gate field effect transistor has a logic input signal terminal 86, 87, 88 and 89. As can be seen from the circuit layout design illustrated in FIG. 12, the two high by two wide conductive gate field effect transistor, AOI circuit shown schematically in FIG. 11 occupies the same space as the three high by two side resistive gate field effect transistor AOI circuit explained hereinbefore and illustrated in FIGS. 9 and 10.

As should now be apparent to those skilled in the art, the logic family implemented with the resistive gate field effect transistors according to the teachings of this invention is not limited to the specific logic circuits discussed previously herein. The resistive gate field effect transistor implemented AND and OR circuits form the basic building blocks of the logic family.

Figure 13:
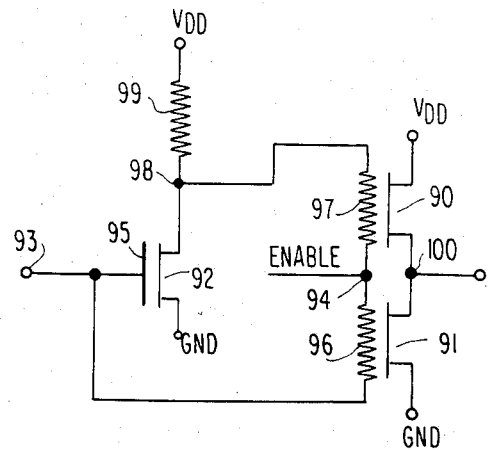
FIG. 13 is a schematic diagram of a tristate driver using resistive gate field effect transistors in accordance with the teachings of the invention.

One further example of a resistive gate field effect transistor implemented logic circuit is shown schematically in FIG. 13. This tristate driver which produces three logic levels of output in response to two logic input signals is constructed of two serially connected resistive gate field effect transistor devices 90, 91 and a third field effect transistor 92. The circuit receives two logic input signals, one at terminal 93 and another at the enable terminal 94. Terminal 93 is connected to the gate 95 of field effect transistor 92 and to one of the two contact points on the resistive gate 96 of the REGFET 91. Another contact point on the gate 96 joins the node for receiving the enable input 94 and a contact point on the resistive gate 97 of the REGFET 90. The other contact point on the gate 97 connects to node 98 to which is also connected the drain of field effect transistor 92 and one terminal of the load resistance 99. Resistive gate field effect transistors 90 and 91 form the AND portions of a tristate driver.

In the prior art, the AND circuits corresponding to the resistive gate field effect transistor 90 is implemented with two conductive gate field effect transistor AND circuits comprised of two field effect transistors as illustrated in FIG. 4. Likewise, the resistive gate field effect transistor 91 is implemented in the prior art by two field effect transistors, also as illustrated in FIG. 4. The device of FIG. 13 operates in a conventional manner. That is, it operates as does the conventional tristate driver comprised of conductive gate field transistors.

As such, a further description of the operation of the tristate driver is not necessary for one having ordinary skill in the art to understand the operation of the tristate driver circuit illustrated in FIG. 13.

As is now clear, many different logic configurations using the resistive gate field effect transistor implemented AND and OR circuits of the invention can be constructed, each of which is within the spirit and scope of the invention disclosed and claimed herein.

While the invention has been particularly shown and described with reference to the preferred embodiments thereof, it will be understood by those skilled in the art that various changes in form and detail may be made therein without departing from the spirit and scope of the invention.

I claim:

1. A field effect transistor logic circuit comprising:
a resistive gate field effect transistor device having a gate electrode composed of a resistive material and at least two input electrodes attached to different portions of the resistive gate, each input electrode being responsive to an independent logic level input signal to independently control the conductivity of different portions of the field effect transistor device channel region as a function of the logic states of the logic level input signals.

2. The field effect transistor logic circuit as claimed in claim 1, wherein said resistive gate field effect transistor device has a source region, a drain region and a channel region therebetween, said gate electrode extending across the length of said channel region between said source and drain region, the resistivity of said gate electrode being selected such that the channel region will conduct only in the presence of at least two independent logic level input signals simultaneously received.

3. The field effect transistor logic circuit as claimed in claim 1, wherein said resistive gate field effect transistor device has a source region, a drain region and a channel region, said gate electrode extending across the width of said channel region, the resistivity of said gate electrode being selected such that the channel region will conduct between the source and drain in response to a single logic level input signal applied to any one of said at least two input electrodes.

4. The field effect transistor logic circuit as claimed in claim 1, wherein said resistive material for said gate electrode is polycrystalline silicon.

5. A field effect transistor AND type logic circuit comprising:
a resistive gate field effect transistor device having a source region, a drain region, a channel region and a gate electrode composed of a resistive material situated over said channel region between said source and drain, at least first and second input terminals connected to different portions of said resistive gate and responsive to independent logic level signals, different portions of said channel being responsive to logic level signals applied to different ones of said input terminals such that each logic level input signal causes only a portion of the channel to conduct, but is insufficient to cause conduction across the entire channel length between the source and drain.

6. A field effect transistor OR type logic circuit comprising:
a resistive gate field effect transistor device having a source region, a drain region, a channel region and a gate electrode composed of a resistive material extending along the width of said channel, at least first and second input terminals connected to different portions of said resistive gate and responsive to independent logic level signals, different portions of said channel along its width being responsive to logic level signals applied to different ones of said input terminals such that each logic level input signal causes a portion of the channel to conduct between the source and drain regions.

7. A field effect transistor logic circuit comprising:
first and second resistive gate field effect transistor devices;
each of said resistive gate field effect transistor devices having a source region, a drain region, a channel region, gate electrode composed of a resistive material situated over said channel region between said source and drain regions and at least first and second input terminals connected to different portions of said resistive gate, each of said input terminals being responsive to independent logic level signals, different portions of said channel being responsive to logic level signals applied to different ones of said input terminals such that each logic level input signal causes only a portion of the channel to conduct, conduction between source and drain occurring only in the presence of logic level input signals to all the input terminals simultaneously;
the drain of said first resistive gate field effect transistor being connected to the drain of said second resistive gate field effect transistor, the source of said first resistive gate field effect transistor being connected to the source of said second resistive gate field effect transistor; and
a load resistance connected to said interconnected drains.

* * * * *